United States Patent
Rosewarne et al.

(10) Patent No.: US 12,198,522 B2
(45) Date of Patent: Jan. 14, 2025

(54) ELECTRICAL SAFETY APPARATUS AND ARRANGEMENT FOR MOBILE MACHINERY

(71) Applicant: Protective Innovations Pty Ltd, Malaga (AU)

(72) Inventors: Karl Rosewarne, Malaga (AU); Shane Ballingall, Malaga (AU); Gary Sargeant, Malaga (AU); Richard Kabzinski, Malaga (AU); Monty Harding, Malaga (AU)

(73) Assignee: Protective Innovations Pty Ltd, Malaga (AU)

( * ) Notice: Subject to any disclaimer, the term of this patent is extended or adjusted under 35 U.S.C. 154(b) by 39 days.

(21) Appl. No.: 18/007,336

(22) PCT Filed: Jul. 26, 2021

(86) PCT No.: PCT/AU2021/050810
§ 371 (c)(1),
(2) Date: Jan. 30, 2023

(87) PCT Pub. No.: WO2022/020882
PCT Pub. Date: Feb. 3, 2022

(65) Prior Publication Data
US 2023/0401949 A1   Dec. 14, 2023

(30) Foreign Application Priority Data

Jul. 28, 2020  (AU) ................................ 2020902652

(51) Int. Cl.
*G01R 19/145*   (2006.01)
*G01R 29/12*    (2006.01)
(Continued)

(52) U.S. Cl.
CPC .......... *G08B 21/02* (2013.01); *G01R 19/145* (2013.01); *G01R 29/12* (2013.01); *G08B 21/182* (2013.01)

(58) Field of Classification Search
None
See application file for complete search history.

(56) References Cited

U.S. PATENT DOCUMENTS

| | | | |
|---|---|---|---|
| 5,548,279 A | * | 8/1996 | Gaines .................. B64D 45/00 |
| | | | 324/253 |
| 6,124,798 A | * | 9/2000 | Tai ........................ B66C 15/065 |
| | | | 340/685 |

(Continued)

FOREIGN PATENT DOCUMENTS

| | | |
|---|---|---|
| AU | 2015207855 A1 | 2/2017 |
| WO | 2018/087524 A1 | 5/2018 |
| WO | 2019/095008 A1 | 5/2019 |

OTHER PUBLICATIONS

International Search Report for International Application No. PCT/AU2021/050810, mailed Sep. 23, 2021, 5 pages.

(Continued)

*Primary Examiner* — John F Mortell
(74) *Attorney, Agent, or Firm* — TraskBritt

(57) ABSTRACT

Electrical safety apparatus for mobile machinery. Apparatus broadly comprises at least one sensor module, which has i) an E-field sensor plate configured to sample an E-field voltage gradient by means of capacitive coupling with an E-field proximate the sensor module; ii) a sensor processor arranged in signal communication with the sensor plate and configured to a. apply frequency discrimination to the voltage gradient; b. if the frequency discrimination satisfies a predetermined frequency range, apply amplitude discrimination to the frequency discriminated signal; and c. if the amplitude discrimination satisfies a predetermined amplitude threshold, generate a limiting signal. Sensor module also includes iii) a transmitter arranged in signal communication with the sensor processor and configured to transmit the limiting signal, and iv) an energizing arrangement configured to provide electrical energy to the sensor processor and transmitter. Apparatus also includes a controller having i) a receiver for receiving the limiting signal; ii) a memory arrangement; and iii) a controller processor arranged in (Continued)

signal communication with the receiver and memory arrangement and configured to interface with, and control, an existing control system of the mobile machinery in accordance with the limiting signal to only allow movement of the machinery, which, when the limiting signal is generated, reduces the sampled E-field voltage below the predetermined amplitude threshold, the controller processor further configured to log details of the limiting signal and associated control in the memory arrangement for forensic purposes.

18 Claims, 5 Drawing Sheets

(51) Int. Cl.
*G08B 21/02* (2006.01)
*G08B 21/18* (2006.01)

(56) References Cited

U.S. PATENT DOCUMENTS

| | | | | |
|---|---|---|---|---|
| 6,806,650 | B2 * | 10/2004 | Johnson | H05H 1/0081 |
| | | | | 315/111.21 |
| 9,595,193 | B1 * | 3/2017 | Duale | G08G 1/0116 |
| 9,776,847 | B2 * | 10/2017 | Mondal | G07C 5/0808 |
| 10,996,253 | B2 * | 5/2021 | King, Jr. | G01R 29/0857 |
| 2019/0120654 | A1 * | 4/2019 | Todasco | G01C 21/3484 |

OTHER PUBLICATIONS

International Written Opinion for International Application No. PCT/AU2021/050810, mailed Sep. 23, 2021, 6 pages.

* cited by examiner

ELECTRICAL SAFETY APPARATUS AND ARRANGEMENT FOR MOBILE MACHINERY

CROSS-REFERENCE TO RELATED APPLICATIONS

This application is a national phase entry under 35 U.S.C. § 371 of International Patent Application PCT/AU2021/050810, filed Jul. 26, 2021, designating the United States of America and published as International Patent Publication WO 2022/020882 A1 on Feb. 3, 2022, which claims the benefit under Article 8 of the Patent Cooperation Treaty to Australian Patent Application Serial No. 2020902652, filed Jul. 28, 2020.

TECHNICAL FIELD

This disclosure broadly relates to the field of electrical safety for mobile machinery, and more specifically to an electrical safety apparatus and an associated electrical safety arrangement for mobile machinery.

BACKGROUND

The following discussion of the background art is intended to facilitate an understanding of the disclosure only. The discussion is not an acknowledgement or admission that any of the material referred to is or was part of the common general knowledge as at the priority date of the disclosure.

Electrical safety is a vital consideration in many situations. In particular, the need for protecting mobile machinery operating near electrical conductors is known in the art of electrical engineering. Mobile machinery is particularly problematic, where so-called 'inattention blindness' can be present, where an operator of the machinery is focused on a specific work task and becomes temporarily 'blind' to what is going on around them.

Coming into contact with overhead power lines is one of the largest causes of fatalities associated with mobile machinery. For example, when a machine contacts a bare, overhead power-line conductor or transmission line, a frame of the machinery can become energized to approximately line-to-ground voltage, often ranging from several hundred to more than 100,000 volts. Various possible scenarios can lead to injury under such circumstance. In one, workers guiding a suspended load, or otherwise in direct contact with both the machine and ground, immediately become a path for electric current. In another, equipment operators are not aware of the line contact, or may perceive themselves to be in immediate danger and attempt to dismount the equipment, simultaneously bridging the high voltage between the equipment and ground.

The current disclosure was conceived in an attempt to propose possible improvements to the field of electrical safety for mobile machinery and associated equipment.

BRIEF SUMMARY

The skilled addressee is to appreciate that reference herein to 'mobile machinery' includes reference to construction machinery, material handling machinery and/or agricultural machinery for performing specific tasks, non-limiting examples of which include excavators, loaders, bulldozers, backhoes, dump trucks, cranes, drills, concrete pumps, forklifts, elevated work platforms, etc. In particular, mobile machinery as referenced herein includes machinery having constituent parts or portions, e.g., ground engaging tools, work platforms, buckets, etc., that may operate near and/or come into contact with electrical conductors typically used in power distribution and/or reticulation systems, such as overhead power lines and underground electrical cables.

The skilled addressee is further to appreciate that reference herein to an electric field, or E-field, and a magnetic field, or a B-field, comprises related aspects of the electromagnetic field. The electric field is produced by stationary charges, and the magnetic field by moving charges (currents). The way in which such charges and currents interact with the electromagnetic field is described by Maxwell's equations and the Lorentz force law. The area around a magnet within which magnetic force is exerted, is called a magnetic field. It is produced by moving electric charges. The presence and strength of a magnetic field is denoted by "magnetic flux lines". The direction of the magnetic field is also indicated by these lines. The closer the lines, the stronger the magnetic field and vice versa. Magnetic fields also generate power in particles, which come in contact with it.

Electric fields are generated around particles that bear electric charge. Positive charges are drawn toward it, while negative charges are repelled. A moving charge has both a magnetic and an electric field, which are two different fields with nearly the same characteristics.

Therefore, they are inter-related in a field called the electromagnetic field. In this field, the electric field and the magnetic field move at right angles to each other. However, they are not dependent on each other and may exist independently. Without the electric field, the magnetic field exists in permanent magnets and electric fields exist in the form of static electricity, in absence of the magnetic field. Magnetic fields are created whenever there is a flow of electric current. As the amount of current flowing increases, the level of the magnetic field increases. Magnetic fields are typically measured in milliGauss (mG). An electric field occurs wherever a voltage is present.

Electric fields are created around appliances and wires wherever a voltage exists—the higher the voltage, the stronger the electric field strength. Electric field strength is measured in volts per meter (V/m). The strength of an electric field decreases rapidly as you move away from the source.

In addition, reference herein to 'GNSS' generally refers to any suitable Global Navigation Satellite System able to provide autonomous geo-spatial positioning, including the GPS, GLONASS, Galileo, Beidou and other regional satellite systems.

According to a first aspect of the disclosure there is provided electrical safety apparatus for mobile machinery, the apparatus comprising:
  at least one sensor module Shaving:
    i) an E-field sensor plate configured to sample an E-field voltage gradient by means of capacitive coupling with an E-field proximate the sensor module;
    ii) a sensor processor arranged in signal communication with the sensor plate and configured to:
      a. apply frequency discrimination to the voltage gradient;
      b. if the frequency discrimination satisfies a predetermined frequency range, apply amplitude discrimination to the frequency discriminated signal; and
      c. if the amplitude discrimination satisfies a predetermined amplitude threshold, generate a limiting signal;

iii) a transmitter arranged in signal communication with the sensor processor and configured to transmit the limiting signal; and iv) an energizing arrangement configured to provide electrical energy to the sensor processor and transmitter; and a controller including:

i) a receiver for receiving the limiting signal;

ii) a memory arrangement; and iii) a controller processor arranged in signal communication with the receiver and memory arrangement and configured to interface with, and control, an existing control system of the mobile machinery in accordance with the limiting signal to only allow movement of the machinery, which, when the limiting signal is generated, reduces the sampled E-field voltage below the predetermined amplitude threshold, the controller processor further configured to log details of the limiting signal and associated control in the memory arrangement for forensic purposes.

In an embodiment, the energizing arrangement comprises a photovoltaic cell configured to supply electrical charge to an electrochemical cell from which the electrical energy is supplied.

In an embodiment, the E-field sensor plate comprises the photovoltaic cell of the energizing arrangement, the sensor plate galvanically isolated from circuitry comprising the sensor module to minimize interference when sampling an E-field voltage gradient.

Typically, the sensor plate is galvanically isolated by means of a DC-to-DC converter with a transformer having galvanically isolated primary and secondary circuits.

In an embodiment, the energizing arrangement includes energy harvesting circuitry configured to harvest environmental energy, e.g., vibration, motion or thermal energy harvesting.

Typically, the sensor module is housed within a housing sealed against the ingress of dirt and/or fluid.

In an embodiment, the housing includes mounts for selectively mounting the sensor module to parts of the mobile machinery, as required.

Typically, the mounts comprise magnetic mounts for selectively releasably mounting the sensor module.

In an embodiment, the sensor module includes a B-field detector comprising two orthogonally arranged B-field sensors configured to detect a B-field proximate the sensor module.

In an embodiment, the sensor processor is configured to process the detected B-field amplitude and frequency by means of a suitable algorithm in order to determine a proximity of the sensor module to a B-field source.

Typically, the sensor processor is configured to apply the frequency and amplitude discrimination by means of a suitable algorithm.

Typically, the predetermined frequency range is between 45 Hz and 65 Hz to detect single-phase electrical signals.

Typically, the predetermined frequency range is between 145 Hz and 185 Hz to detect three-phase electrical signal, e.g., twisted three-phase conductors.

In an embodiment, the sensor module includes an analogue bandpass filter arranged in signal communication with the E-field sensor plate and/or B-field detector and is configured to filter the sampled voltage gradient at such predetermined frequency range(s).

Typically, the predetermined amplitude threshold is user-selectable.

Typically, the transmitter and receiver comprise wireless transmitters, such as Bluetooth Low Energy (BLE), or the like, but variations hereon are possible and expected.

In an embodiment, the sensor processor is configured to transmit, via the transmitter, a periodic monitor signal whereby the controller is able to verify proper operation of the sensor module absent the limit signal being transmitted.

Typically, the memory arrangement comprises non-volatile computer memory.

In an embodiment, the controller processor is configured to log details of the limiting signal and associated control selected from a group consisting of time, duration, movement details, geographic location, operator details, and mobile machinery details.

In an embodiment, the controller processor interfaces with, and controls, the existing control system of the mobile machinery by means of a Controller Area Network (CAN bus) interface.

In an embodiment, the sensor module includes an Inertial Measurement Unit (IMU) configured to detect motion of a portion of the mobile machinery in three-dimensional space.

In an embodiment, the controller processor is configured to track and log such IU detected motion in three-dimensional space.

In an embodiment, the controller processor is configured to generate a virtual envelope around the mobile machinery in accordance with the tracked motion and the limiting signal, the virtual envelope indicative of three-dimensional space about the mobile machinery in which the machine is able to move unhindered in accordance with the predetermined amplitude threshold.

In an embodiment, the controller processor is configured to generate a virtual envelope around the mobile machinery in accordance with the tracked motion and user-selectable input, the virtual envelope indicative of three-dimensional space about the mobile machinery in which the machine is allowed to move unhindered in accordance with the user input, i.e., a user defines the virtual envelope.

In an embodiment, the controller includes a GNSS sensor, the controller processor configured to compare a geographic position of such GNSS sensor to a database of known geographic positions of electrical conductors and to disable the existing control system of the mobile machinery if the geographic positions are within a predetermined proximity.

According to a second aspect of the disclosure there is provided an electrical safety arrangement for mobile machinery, the arrangement comprising:

mobile machinery; and electrical safety apparatus in accordance with the first aspect of the disclosure, wherein at least one sensor module is mounted to a part or portion of the machinery operable near an electrical conductor and the controller is interfaced with an existing control system of such mobile machinery, the controller only allowing movement of the part or portion, which, when the limiting signal is generated, reduces the sampled E-field voltage below the predetermined amplitude threshold.

According to a third aspect of the disclosure there is provided mobile machinery including electrical safety apparatus in accordance with the first aspect of the disclosure above.

According to a further aspect of the disclosure there is provided electrical safety apparatus for mobile machinery, an electrical safety arrangement for mobile machinery and mobile machinery, substantially as herein described and/or illustrated.

BRIEF DESCRIPTION OF THE DRAWINGS

The description will be made with reference to the accompanying drawings in which.

DETAILED DESCRIPTION

Figure 1:
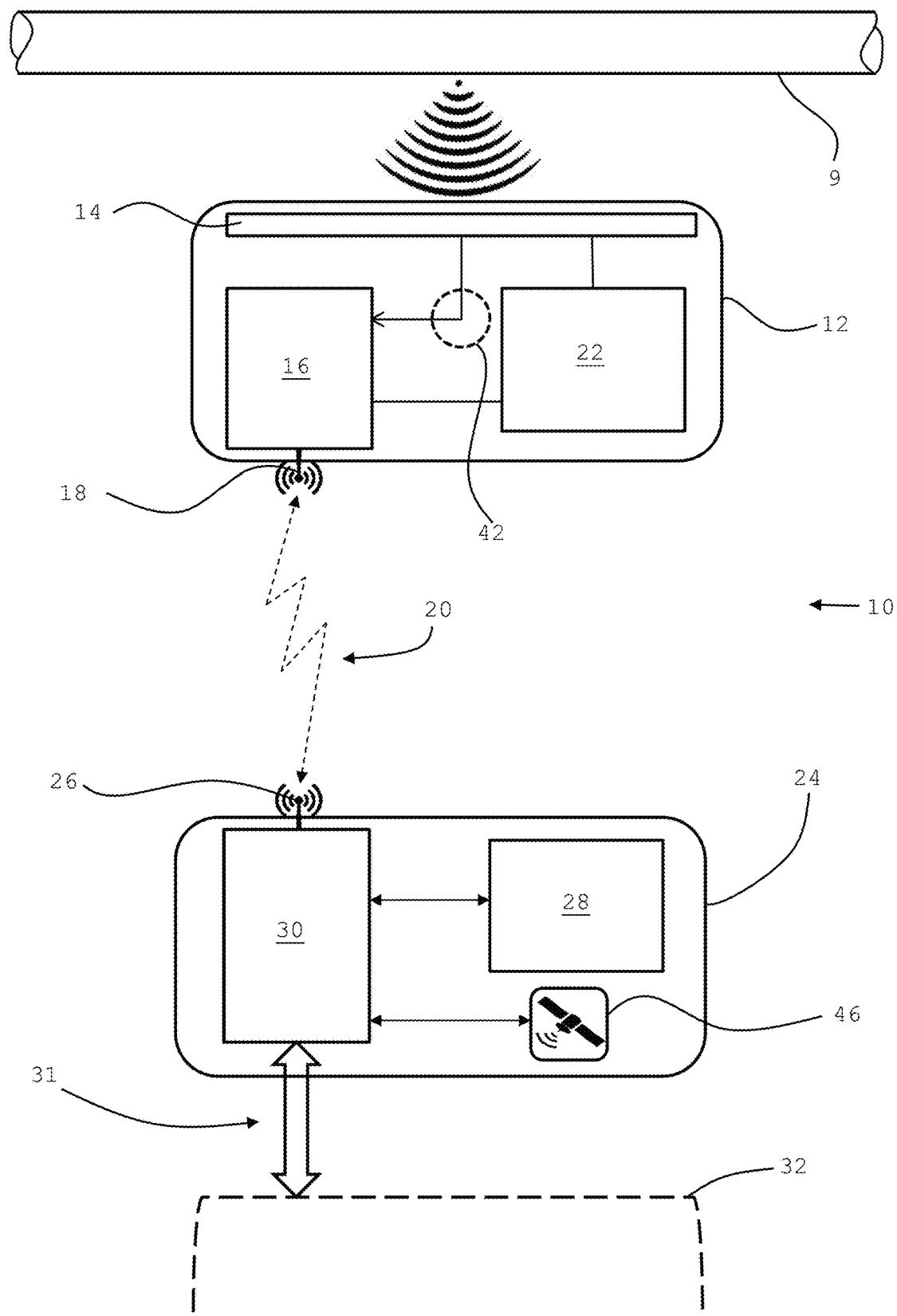
FIG. 1 is a diagrammatic representation of one embodiment of electrical safety apparatus for mobile machinery, in accordance with an aspect of the disclosure.

Further features of the disclosure are more fully described in the following description of several non-limiting embodiments thereof. This description is included solely for the purposes of exemplifying the disclosure to the skilled addressee. It should not be understood as a restriction on the broad summary, disclosure or description of the disclosure as set out above.

In the figures, incorporated to illustrate features of the example embodiment or embodiments, like reference numerals are used to identify like parts throughout. Additionally, features, mechanisms and aspects well-known and understood in the art will not be described in detail, as such features, mechanisms and aspects will be within the understanding of the skilled addressee.

With reference now to the accompanying figures, there is shown a broad embodiment of electrical safety apparatus 10 for mobile machinery 8. As described above, such mobile machinery 8 may take a variety of forms and generally include parts or portions 44, such as ground engaging tools, work platforms, buckets, etc., that may operate near and/or come into contact with electrical conductors 9 typically used in power distribution and/or reticulation systems, such as overhead power lines and underground electrical cables.

Apparatus 10 has been conceived to provide safety to such mobile machinery 8 from accidental or inadvertent contact of such portions 44 with an electrical conductor 9, generally by interfacing with an existing control system 32 of the mobile machinery 8 and providing intelligent limiting control depending on the circumstances, as broadly described and illustrated herein.

In a broad embodiment, apparatus 10 comprises at least one sensor module 12 having an E-field sensor plate 14, which is configured to sample an E-field voltage gradient produced by an electrical conductor 9 by means of capacitive coupling with such an E-field proximate the sensor module 12.

Sensor module 12 also generally includes a sensor processor or microcontroller 16, which is arranged in signal communication with the sensor plate 14 and configured to perform the following general steps:

a. apply frequency discrimination to the sampled voltage gradient;

b. if the frequency discrimination satisfies a predetermined frequency range, apply amplitude discrimination to the frequency discriminated signal; and c. if the amplitude discrimination satisfies a predetermined amplitude threshold, generate a limiting signal 20.

Sensor module 12 also includes a transmitter 18, which is arranged in signal communication with the sensor processor 16 and is configured to transmit the limiting signal 20. Also included is an energizing arrangement 22, which is configured to provide electrical energy to the sensor processor 16 and transmitter 18, as required.

Apparatus 10 further includes a controller 24, which includes a receiver 26 for receiving the limiting signal 20, a memory arrangement 28, and a controller processor 30 or microcontroller 16, which is arranged in signal communication with the receiver 26 and the memory arrangement 28 and is configured to interface 31 with, and control or override as required, an existing control system 32 of the mobile machinery 8. Such control and override are performed in accordance with the limiting signal 20 to only allow movement of the machinery 8, typically the relevant part or portion 44, which, when the limiting signal 20 is generated and received, reduces the sampled E-field voltage below the predetermined amplitude threshold. The controller processor 30 is further typically configured to log details of the limiting signal and associated control of the existing control system 32 in the memory arrangement 28 for forensic purposes.

In this manner, the sensor module 12 is able to function as an E-Field sensor designed to sense the presence of, for example, a 50/60 Hz AC electrical field. Sensing of the E-Field is achieved by utilizing the sensor plate 14. In one embodiment, circuitry is used to amplify and filter the signal on the sensor plate 14 to determine its frequency and amplitude. If the frequency is 'in-band' and if the amplitude is sufficient, an alarm condition is indicated and wirelessly transmitted to the controller 24.

As described above, whenever a conductor, wire or transmission line 9 is electrically energized, an Electric Field or E-field is generated around it. In free space, this E-field is uniformly distributed, and when referenced to ground, such as it would be with an overhead transmission line, it creates a voltage gradient with respect to the ground. The sensor module 12 is generally designed to detect this voltage gradient.

The skilled addressee is to appreciate that various circuitry designs can achieve the functionality of the various elements described herein. Such variation is expected and within the scope of the disclosure. For example, in one embodiment, the sensor module 12 may include an analogue bandpass filter 42, which is arranged in signal communication with the E-field sensor module 12 and is configured to filter the sampled voltage gradient, as required.

The sensor module 12 samples the voltage gradient using capacitive coupling to the sensor plate 14 to measure a voltage and frequency. The sensor module 12 is generally calibrated so that a when a predetermined voltage gradient is sensed at the frequency of interest, e.g., 50 Hz or 60 Hz, the limiting signal 20 is generated as an alert. The sensor module and/or controller 24 may also include onboard lamps or lights, which are illuminated as appropriate and the limiting signal 20 is transmitted to the controller 24. In this manner, the frequency discrimination mitigates possible false alerts from static discharges or other static electrical fields and other potentially interfering signals.

Figure 2:
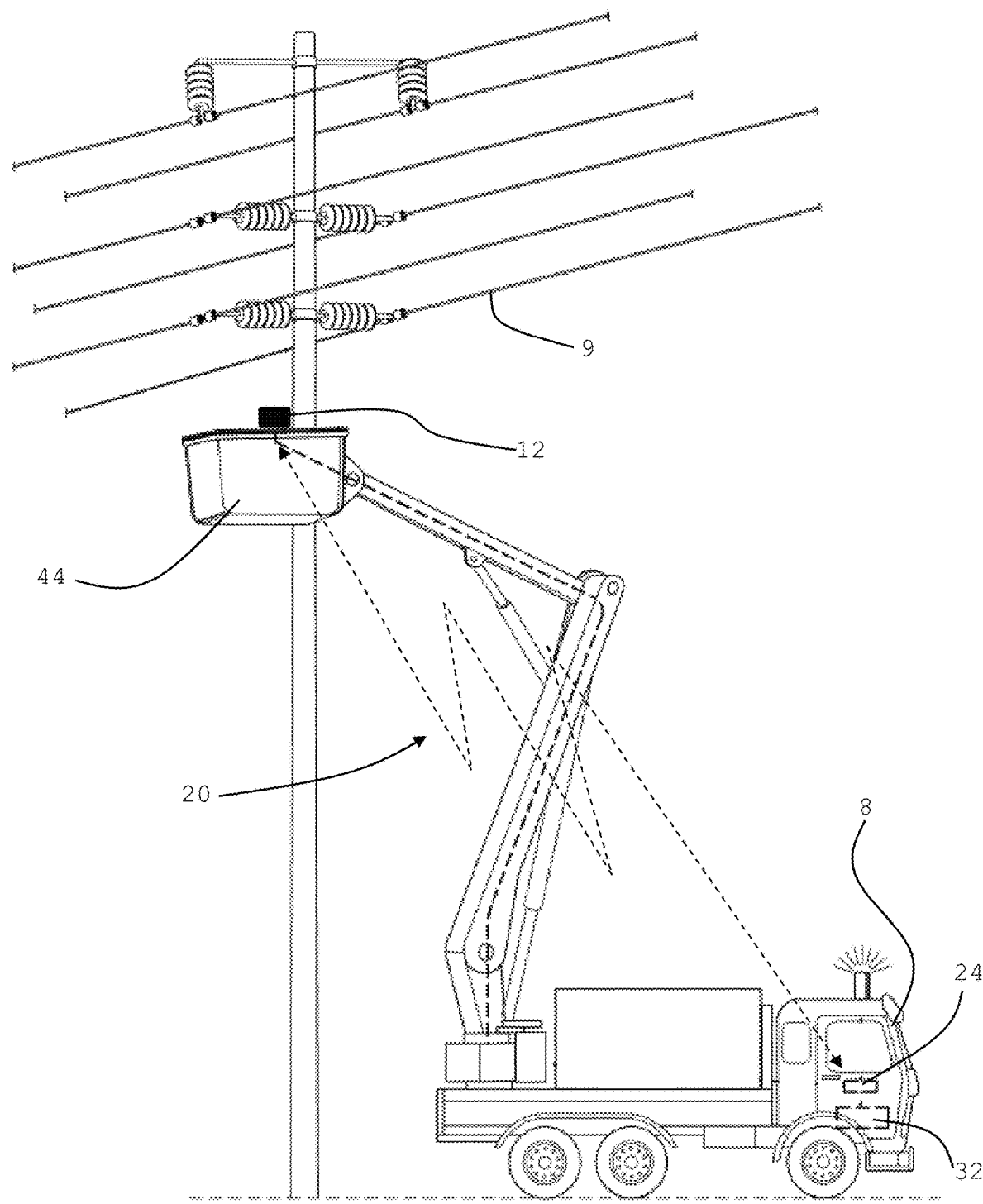
FIG. 2 is a diagrammatic representation of an electrical safety arrangement for mobile machinery, in accordance with an aspect of the disclosure.
Figure 3:
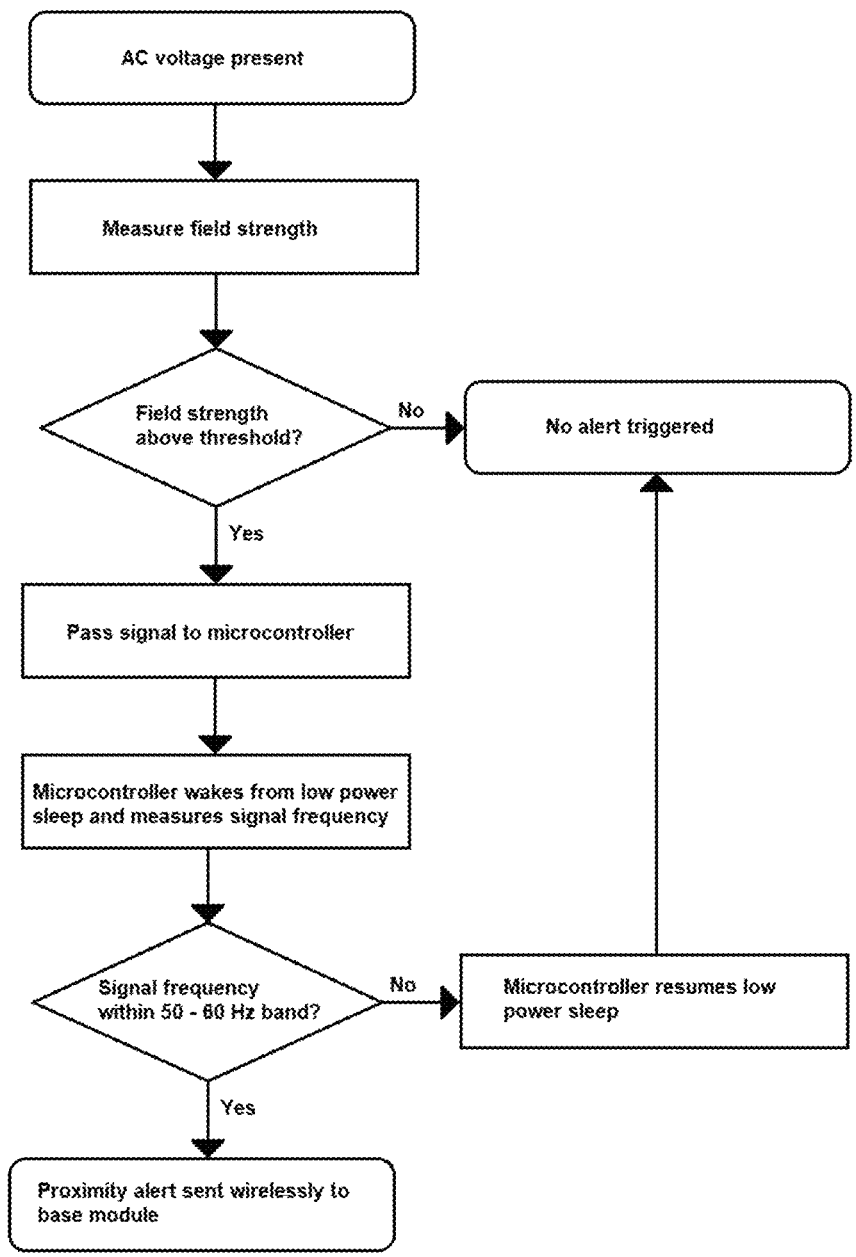
FIG. 3 is a flow diagram representative of method steps performed during operation of a sensor module of the electrical safety apparatus for mobile machinery of FIG. 1.
Figure 4:
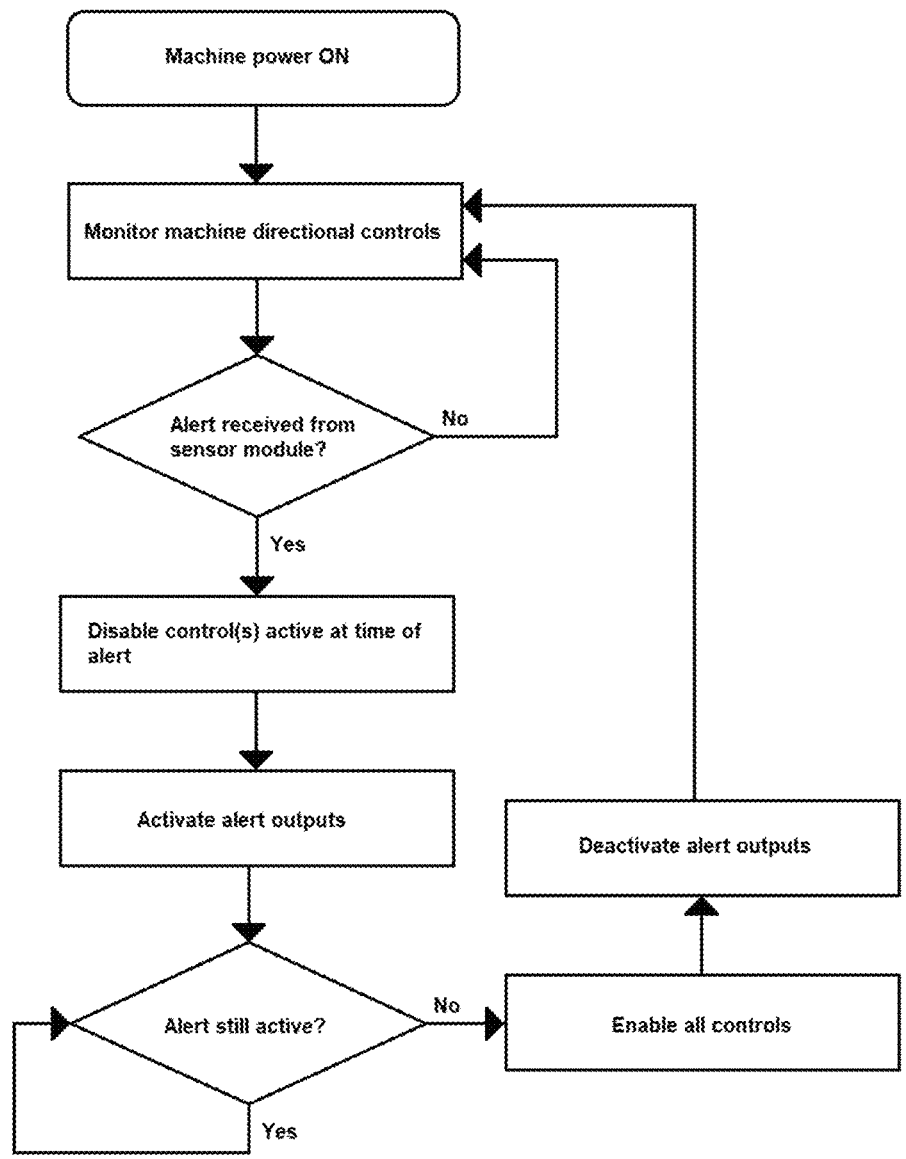
FIG. 4 is a flow diagram representative of method steps performed during operation of a controller of the electrical safety apparatus for mobile machinery of FIG. 1.
Figure 5:
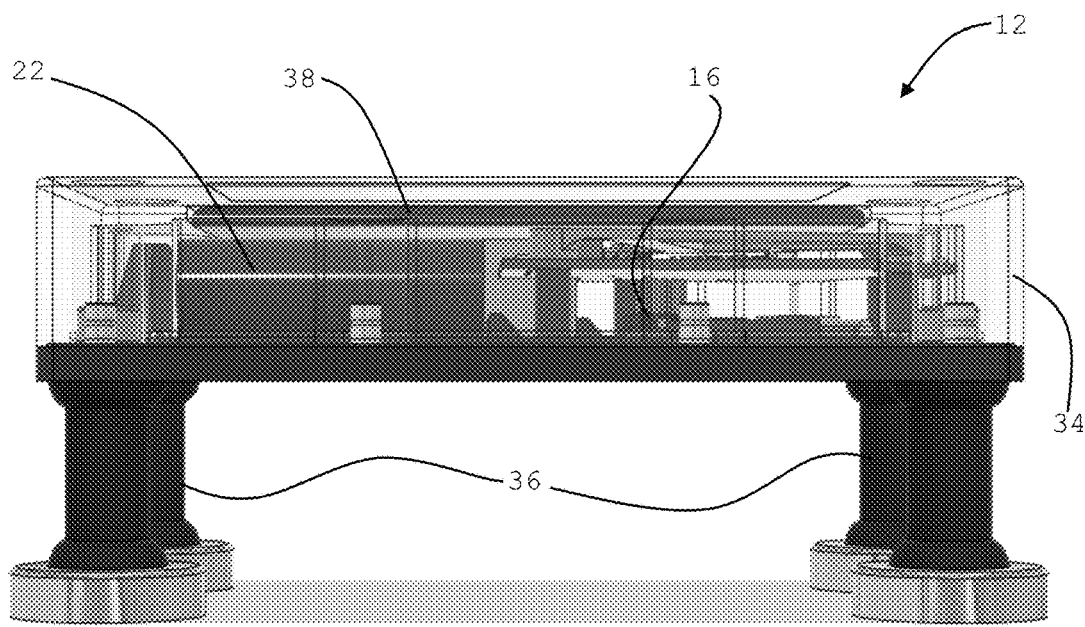
FIG. 5 is a side-view diagrammatic representation of one embodiment of a sensor module of the electrical safety apparatus for mobile machinery of FIG. 1.
Figure 6:
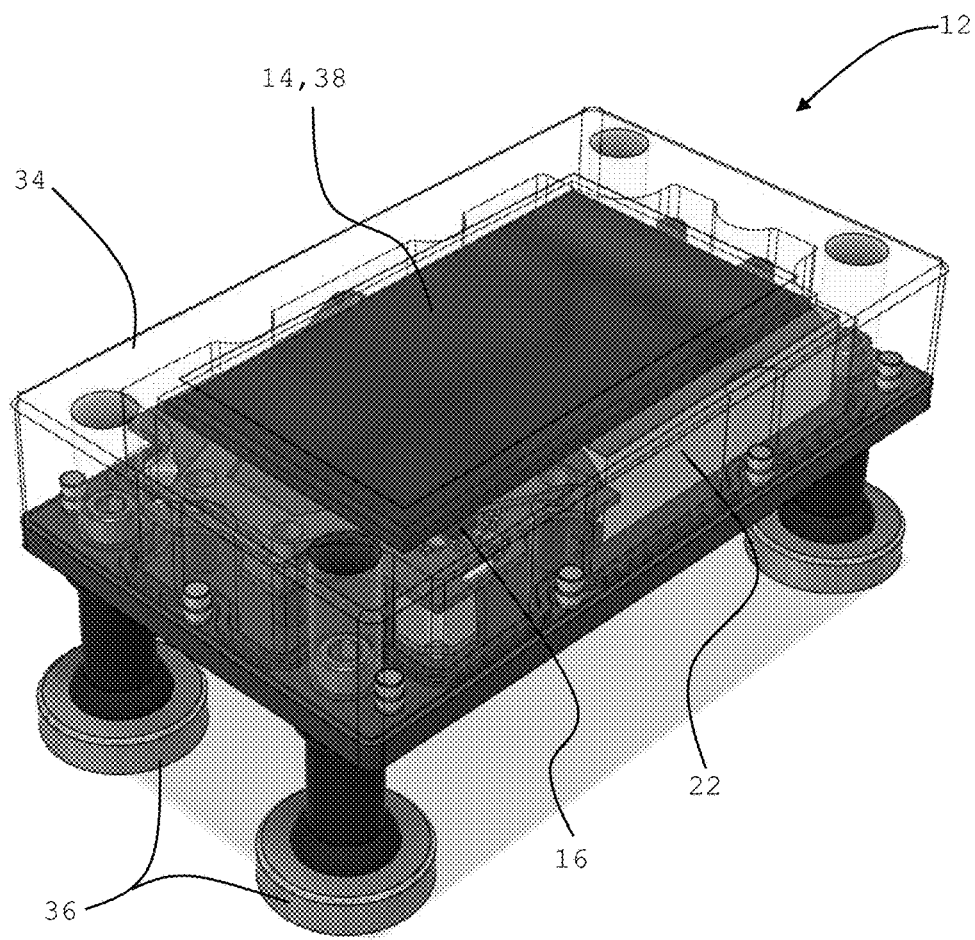
FIG. 6 is a perspective view diagrammatic representation of the sensor module of FIG. 5.

In a typical embodiment, the sensor module 12 is housed within a housing 34, which is sealed against the ingress of dirt and/or fluid. The housing 34 typically includes mounts 36 for selectively mounting the sensor module 12 to the parts or portions 44 of the mobile machinery 8, as required. For example, a plurality of sensor modules 12 can be positioned on an elevated work platform, as shown in FIG. 2, where required, i.e., on a work basket, on a boom arm, etc. In one embodiment, the mounts 36 may comprise magnetic mounts for selectively and releasably mounting the sensor module 12 where needed. In the embodiment exemplified in FIGS. 5 and 6, the sensor module 12 is approximately 150 mm in length×80 mm in width x 30 mm in height and the housing 34 is made of tough UV resistant polycarbonate and sealed to Ingress Protection Code 67 (IP67) rating.

In one embodiment, the energizing arrangement 22 includes a photovoltaic cell(s) 38 configured to supply electrical charge to an electrochemical cell(s), such as a battery, from which the electrical energy is supplied to the sensor processor 16 and transmitter 18. In one embodiment, the energizing arrangement 22 may also include energy harvesting circuitry configured to harvest environmental energy, e.g., vibration, motion or thermal energy harvesting from the mobile machinery 8, or the like.

In a preferred embodiment, the E-field sensor plate 14 comprises the photovoltaic cell or solar panel, with the sensor plate 14 galvanically isolated from circuitry comprising the sensor module 12. This provides the sensor module 12 with a large area detection plate, which provides high sensitivity in the detection of AC E-fields. For the photovoltaic cell 38 or solar panel to be effectively used as a sensor plate, it is electrically isolated from the rest of the sensor circuitry while maintaining its electrical output for use by the energizing arrangement 22. To prevent interference with proper and accurate detection, the positive and negative terminals of the solar panel is galvanically isolated from the circuitry comprising the sensor module 12.

Such galvanic isolation is typically achieved by utilizing a DC-to-DC converter with a transformer that has galvanically isolated primary and secondary circuits. Such an arrangement effectively isolates the solar panel from the rest of the circuit, save for a small amount of capacitance from primary to secondary, which can essentially be ignored at 50 or 60 Hz. Since the electrical output of the solar panel is fed via the DC-to-DC converter, it can still be used to charge the internal battery of the sensor module 12.

The skilled addressee is to appreciate that the particular configuration of the sensor module 12, as described, provides for a mobile, movable and free-standing unit able to perform the functions required. The sensor module 12 can be placed or mounted on any part of a piece of mobile machinery, as required, to perform the functions described. The sensor module 12 can also be easily retrofitted to existing machinery. In particular, the incorporation of the sensor plate 14 and the photovoltaic cell(s) or solar panel further facilitates such operation, as the sensor module 12 is able to generate its own electricity while the photovoltaic cell 38 also provides an increased surface area as the sensor plate 14.

In one embodiment, the sensor module 12 may also additionally include a B-field detector, which typically comprises two orthogonally arranged B-field sensors configured to detect a B-field proximate the sensor module 12. Via the use of coils, magnetic sensors or magnetometers of any kind, the sensor module 12 can also detect AC or DC magnetic fields, or B-fields. In order to be able to detect B-fields in any orientation, at least two B-field detectors are used and arranged at 90 degrees to each other, so that if one of the detectors is oriented in parallel with and perpendicular to a particular B-field resulting in zero signal output, the second detector would be at maximum output, since it is at right angles to the B-field. As a result of mounting the B-field detectors at right angles to each other, placing the detectors at any orientation with respect to the applied B-field will always result in an output signal.

The output signal from the B-field detectors is typically combined and processed in a similar way to that of the E-field signal from the sensor plate 14. The signal amplitude and frequency are sampled in order to determine proximity to a B-field source, such as a power transmission line 9. In an embodiment, the sensor module 12 is configured to process the detected B-field amplitude and frequency by means of a suitable algorithm in order to determine a proximity of the sensor module to such a B-field source. In such a manner, suitable processor or microcontroller algorithm can be adapted to determine the strength of the B-field and can also deal with interference from the earth's magnetic field by utilizing and auto-null function, or the like.

Similarly, the sensor processor 16 is generally configured to apply the frequency and amplitude discrimination of a sampled E-field by means of a suitable algorithm. Typically, the predetermined frequency range is between 45 Hz and 70 Hz and the predetermined amplitude threshold is user-selectable and may be determined or calibrated during manufacture or initial commissioning of the sensor module 12.

The skilled addressee is to appreciate that the predetermined frequency range may vary and/or comprise a number of frequency bands. For example, 50 Hz or 60 Hz frequency discrimination is useful in detecting single-phase electrical signals. In one embodiment, the frequency discrimination may also be performed between 145 Hz and 185 Hz, such as 150 Hz or 180 Hz, to detect three-phase electrical signal, e.g., twisted three-phase conductors carrying electrical current at either 50 Hz or 60 Hz, respectively. Similarly, other frequency bands may be included, as required, in order to facilitate frequency discrimination at other frequencies and/or harmonics of conventional electric supply frequencies.

Accordingly, to determine if there is hazardous proximity to an E-field, the sensor processor 16 or microcontroller employs such an algorithm to check the amplitude and frequency of the sampled E-field. As described above, the E-field signal may also be pre-filtered by an analogue bandpass filter 42 prior to being presented to the sensor processor or microcontroller 16. In a typical example, an AC component of the sampled signal is derived and used to determine the frequency, while a rectified DC voltage is used to determine whether or not the signal exceeds the predetermined amplitude threshold or calibrated level.

In addition, as safety apparatus, in order to provide a high level of confidence and reliability, each sensor module 12 is typically configured to transmit a 'heartbeat' signal, so that the controller can detect the potential loss of a sensor module 12, log the event (as described below) and alert an operator. In such an event, the controller can also inhibit machine operation when a malfunctioning, lost or damaged sensor is discovered.

Accordingly, in one embodiment, the sensor processor 16 is configured to transmit, via the transmitter 18, a periodic monitor or heartbeat signal whereby the controller 24 is able to verify proper operation of the sensor module 12 absent the limit signal being transmitted. A part of this protocol ensures that a sensor module 12 periodically transmits such a 'heartbeat' signal with, for example, a sensor identifier to the controller 24. In one embodiment, the controller 24 can be paired with, for example, six sensor modules 12 and stores a lookup table of the respective sensor identifiers. By periodically 'listening' for a sensor 'heartbeat' and utilizing a suitable watchdog timer algorithm, the controller processor 30 can determine whether a sensor module 12 is correctly functioning or present.

In one embodiment, the controller 24 is configured to control the mobile machinery operation or functions either by switching solenoids and relays or via a Controller Area Network (CAN bus) interface, as is known in the art of machinery control. Similarly, the controller can employ a BLUETOOTH® BLE interface to communicate with, for example, an ANDROID® tablet or mobile phone to provide a user interface to provide operational information. Provision can also be also made for connections to control external lamps and warning devices if needed, or the like. Such a UI can provide a user with all status and alarm messages by way of text messages and graphics. Logged data can also be retrieved over this interface.

In addition, the controller processor 30 may also be configured to provide operational information and/or status information of apparatus 10 to an existing display screen, user interface or control panel of mobile machinery 8 via a suitable interface, such as a conventional CAN bus, or the like. For example, sensor module operation and status can be displayed, detected alarms and sampled voltage gradient, E-field and B-field presence, etc., can all the displayed as required to allow an operator of mobile machinery 8 to have situational awareness.

The controller 24 can typically connect directly to conventional hydraulic solenoids in mobile machinery 8, or to a CAN bus, to effect control of machine movement in order to prevent contact with a detected hazard. One embodiment of the controller 24 sees it enclosed in an IP67 rated modular enclosure, approximately 170L×120 W×35H (millimeters), also including a mating connector. Whilst the controller 24 typically wirelessly communicates with sensor modules 12, it is typically hard-wired to the mobile machinery 8 to obtain power from and to control the machine 8.

Typically, the memory arrangement 28 comprises nonvolatile computer memory. For example, the controller has internal flash memory to allow time-stamped event logging. A real-time, battery-backed clock and calendar device may be incorporated into the controller to provide the time stamp. The flash memory is soldered onto a PCB so it cannot be removed or tampered with. If the controller 24 is functional, this data can be retrieved via the BLUETOOTH® interface. Provision can also be made on the PCB to be able to directly connect to the flash memory for forensic retrieval of the data in the event of a catastrophic failure, which may not have damaged the flash memory.

As described above, in a typical embodiment, the controller processor 30 is configured to log details of the limiting signal 20 and associated control selected from a group consisting of time, duration, movement details, geographic location, operator details, and mobile machinery details etc. In this manner, the controller 24 has the ability to log and time stamp system events such as hazard detections, under-voltage, over-voltage and the total accumulated system run time and other events as required by the user. These logs are stored in the memory arrangement 28.

Typically, the controller 24 operates from a nominal machine or vehicle supply of 12 or 24 volts and is fully protected against reverse polarity connection, brown-out and transient voltages. In the event of inadvertent loss of power during operation, the controller 24 can utilize an internal backup source to initiate an alert to the user and perform an orderly shutdown, which includes logging the event. As a safety precaution, the controller 24 can be configured to 'fail safe', by sending the appropriate data onto the CAN bus to inhibit machine movement and inhibiting all wired outputs from driving solenoids or relays.

In this manner, apparatus 10 manages the immediate lockout of movement into a hazard when a hazard has been detected. Generally, movement is only allowed in the opposite direction until the hazard has been cleared. Thus, the controller 24 takes into account which operator control input direction was active at the time a proximity alert was received, subsequently only allowing movement in the opposite direction. Once the sensor module 12 has cleared the hazard, normal control and motion of the machine are restored. The detection of a hazard and the direction of movement at the time and the subsequent movement to clear the hazard are logged into flash memory.

In another embodiment, the sensor module 12 may also include at least one Inertial Measurement Unit (IMU) configured to detect motion of a portion of the mobile machinery 8 in three-dimensional space. As will be appreciated by the skilled addressee, such an IMU may include any suitable device that measures a body's specific force, angular rate, and/or orientation, using a combination of accelerometers, gyroscopes, and/or magnetometers.

In such an embodiment, the controller processor 30 is typically configured to track such motion as detected by the IMU of the sensor module 12. In particular, the controller processor 30 may be configured to generate a virtual envelope around the mobile machinery 8 in accordance with the tracked motion and the limiting signal. Such a virtual envelope is generally indicative of three-dimensional space about the mobile machinery 8 in which the machine is able to move unhindered in accordance with the predetermined amplitude threshold.

For example, in an example where a piece of mobile machinery is fitted with a plurality of sensor modules 12 each having an IMU using 9 degrees of freedom, i.e., 9-axis movement detection via a 3-axis accelerometer, a 3-axis magnetometer and a 3-axis gyroscope, it is possible to determine with relative accuracy the location, orientation and movement of each sensor module 12 and therefore the machine's movement without needing to monitor the machine's control inputs. Where the controller processor 30 generates a virtual envelope as described, it allows the apparatus 10 to determine through such sensed movements any "offending" control motions, which will bring the machine closer to danger, e.g., a dangerous live conductor.

In addition, such detected the relative motion of each sensor module 12 can be correlated with any changes in amplitude of the detected E-Field or B-Field. Such a correlation would allow the apparatus 10 to calculate the distance to a detected conductor, and the voltage of the conductor, as well as to "map" the relative location of the conductor through the distance and movement calculations undertaken between the sensors. Variations hereon are possible and expected and within the scope of the disclosure.

In a further embodiment, the controller processor 30 is further configured to generate a virtual envelope around the mobile machinery 8 in accordance with the tracked motion and user-selectable input, the virtual envelope indicative of three-dimensional space about the mobile machinery 8 in which the machine 8 is allowed to move unhindered in accordance with the user input, i.e., a user is able to define the virtual envelope manually. For example, is a specific virtual envelope is desired, the user can move the part of the machinery to an edge of such a desired virtual envelope and indicate to the controller processor 30 that such a point is to be a limit of motion.

In a yet further embodiment, the controller 24 includes a GNSS sensor 46, with the controller processor 30 configured to compare a geographic position of such GNSS sensor 46 to a database of known geographic positions of electrical conductors. The controller processor 30 is typically configured to disable the existing control system 32 of the mobile machinery 8 if the geographic positions are within a predetermined proximity. In an example, the database of known geographic positions of electrical conductors is stored within the memory arrangement 28, or the like.

The controller 24 will typically operate at a voltage down to 4.8 Volts so that engine start scenarios will not cause an inadvertent reset. An on-board power backup facility senses a brownout or inadvertent loss of power situation and allows the controller 24 to conduct an orderly shutdown.

It is believed to be particularly advantageous that the disclosure provides for one or more wireless E-field sensor modules 12 coupled to controller 24. Apparatus 10 is designed to detect the proximity of energized AC 50 Hz or 60 Hz electrical transmission lines or cables (both single phase and three-phase) in order to prevent inadvertent contact with hazardous and potentially lethal voltages. Apparatus 10 is designed to prevent mobile machinery 8 from contacting energized overhead high-voltage transmission lines when a hazardous situation is detected. This is achieved by stopping the machine in the current direction of movement, and only allowing movement away from the hazard until it is cleared.

In the manner described, the sensor modules 12 are capable of detecting E-fields surrounding energized distribution and transmission lines 9. They are typically mounted strategically on the boom of a crane or onto an elevated area of the basket of an elevated work platform. Each sensor module 12 is paired to and communicates with the controller 24, which is hard-wired into the control system of the machine 8. The controller 24 can either directly control hydraulic solenoids utilizing solid-state switching or may utilize a J1939 CAN Bus connection, depending on the application.

When a sensor module detects the proximity of a high-voltage transmission line, it illuminates inbuilt lamps or generates an alert on a GUI to indicate the level of the hazard, and transmits its status to the controller 24, which disables further movement toward the hazard, allowing only a single opposite movement to 'back out' of the hazardous area. Typically, movement in any other direction is inhibited, however the behavior can be configured depending on customer requirements. When apparatus 10 is correctly installed, calibrated and commissioned, it is virtually impossible for an operator to invoke movement that results in contact with an energized electrical transmission line or cable.

In addition, of particular application is use of apparatus 10 for height and slew limiting operations. For example, such height and slew limiting is conventionally used in certain instances where mobile machinery is used to define a 'safe' virtual envelope within which such machinery, or constituent parts thereof, can operate. For example, in railway works where an overhead catenary is present, a machine is typically programmed at start of operation to operate only within an envelope, which will keep the machine out of contact with dangerous live conductors. Apparatus 10 allows a backup safety system in such instances, which does not require specific set-up (which can be overlooked in practice).

Optional embodiments of the disclosure may also be said to broadly consist in the parts, elements and features referred to or indicated herein, individually or collectively, in any or all combinations of two or more of the parts, elements or features, and wherein specific integers are mentioned herein, which have known equivalents in the art to which the disclosure relates, such known equivalents are deemed to be incorporated herein as if individually set forth. In the example embodiments, well-known processes, well-known device structures, and well-known technologies are not described in detail, as such will be readily understood by the skilled addressee.

The use of the terms "a", "an", "the", and/or similar referents in the context of describing various embodiments (especially in the context of the claimed subject matter) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. As used herein, the term "and/or" includes any and all combinations of one or more of the associated listed items. No language in the specification should be construed as indicating any non-claimed subject matter as essential to the practice of the claimed subject matter.

Spatially relative terms, such as "inner," "outer," "beneath," "below," "lower," "above," "upper," and the like, may be used herein for ease of description to describe one element or feature's relationship to another element(s) or feature(s) as illustrated in the figures.

Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

It is to be appreciated that reference to "one example" or "an example" of the disclosure, or similar exemplary language (e.g., "such as") herein, is not made in an exclusive sense. Various substantially and specifically practical and useful exemplary embodiments of the claimed subject matter are described herein, textually and/or graphically, for carrying out the claimed subject matter.

Accordingly, one example may exemplify certain aspects of the disclosure, whilst other aspects are exemplified in a different example. These examples are intended to assist the skilled person in performing the disclosure and are not intended to limit the overall scope of the disclosure in any way unless the context clearly indicates otherwise. Variations (e.g., modifications and/or enhancements) of one or more embodiments described herein might become apparent to those of ordinary skill in the art upon reading this disclosure. It is expected for skilled artisans to employ such variations as appropriate, and for the claimed subject matter to be practiced other than as specifically described herein.

The invention claimed is:

1. Electrical safety apparatus for mobile machinery, the apparatus comprising:
   at least one sensor module comprising:
      an electronic field (E-field) sensor plate configured to sample an E-field voltage gradient by means of capacitive coupling with an E-field proximate the sensor module;
      a sensor processor arranged in signal communication with the sensor plate and configured to:
      apply frequency discrimination to the voltage gradient;
      if the frequency discrimination satisfies a predetermined frequency range, apply amplitude discrimination to the frequency discriminated voltage gradient; and
      if the amplitude discrimination satisfies a predetermined amplitude threshold, generate a limiting signal;
      a transmitter arranged in signal communication with the sensor processor and configured to transmit the limiting signal;
      an energizing arrangement configured to provide electrical energy to the sensor processor and transmitter; and
      an Inertial Measurement Unit (IMU) configured to detect motion of a portion of the mobile machinery in three-dimensional space; and
   a controller comprising:
      a receiver for receiving the limiting signal;
      a memory arrangement; and
      a controller processor arranged in signal communication with the receiver and memory arrangement and configured to:
      interface with and control, an existing control system of the mobile machinery in accordance with the limiting signal to only allow movement of the machinery, which, when the limiting signal is generated, reduces the sampled E-field voltage below the predetermined amplitude threshold;
      track and log the IMU detected motion in three-dimensional space in order to generate a virtual envelope around the mobile machinery in accordance with such tracked motion and the limiting signal, the virtual envelope indicative of three-dimensional space about the mobile machinery in which the machine is able to move unhindered in accordance with the predetermined amplitude threshold and/or user input; and
      log details of the limiting signal and associated control in the memory arrangement for forensic purposes.

2. The electrical safety apparatus of claim 1, wherein the energizing arrangement comprises a photovoltaic cell configured to supply electrical charge to an electrochemical cell from which the electrical energy is supplied.

3. The electrical safety apparatus of claim 2, wherein the E-field sensor plate comprises the photovoltaic cell of the energizing arrangement, the E-field sensor plate galvanically isolated from circuitry comprising the sensor module to minimize interference when sampling an E-field voltage gradient.

4. The electrical safety apparatus of claim 3, wherein the E-field sensor plate is galvanically isolated by means of a DC-to-DC converter with a transformer having galvanically isolated primary and secondary circuits.

5. The electrical safety apparatus of claim 1, wherein the energizing arrangement includes energy harvesting circuitry configured to harvest one of more of vibration energy, motion energy, and thermal energy.

6. The electrical safety apparatus of claim 1, wherein the sensor module includes a magnetic field (B-field) detector comprising two orthogonally arranged B-field sensors configured to detect a B-field proximate the sensor module.

7. The electrical safety apparatus of claim 6, wherein the sensor processor is configured to process a detected B-field amplitude and frequency by means of a suitable algorithm in order to determine a proximity of the sensor module to a B-field source.

8. The electrical safety apparatus of claim 1, wherein the sensor processor is configured to apply the frequency and amplitude discrimination by means of an algorithm.

9. The electrical safety apparatus of claim 1, wherein the predetermined frequency range is between 45 Hz and 65 Hz to detect single-phase electrical signals.

10. The electrical safety apparatus of claim 1, wherein the predetermined frequency range is between 145 Hz and 185 Hz to detect three-phase electrical signals.

11. The electrical safety apparatus of claim 1, wherein the sensor module includes an analogue bandpass filter arranged in signal communication with one or more of the E-field sensor plate and a B-field detector, the sensor module configured to filter the sampled voltage gradient at the predetermined frequency range.

12. The electrical safety apparatus of claim 1, wherein the predetermined amplitude threshold is user-selectable.

13. The electrical safety apparatus of claim 1, wherein the sensor processor is configured to transmit, via the transmitter, a periodic monitor signal whereby the controller is able to verify operation of the sensor module in the absence of the limit signal being transmitted.

14. The electrical safety apparatus of claim 1, wherein the controller processor is configured to log details of the limiting signal and associated control selected from a group consisting of time, duration, movement details, geographic location, operator details, and mobile machinery details.

15. The electrical safety apparatus of claim 1, wherein the controller processor interfaces with, and controls, the existing control system of the mobile machinery by means of a Controller Area Network (CAN bus) interface.

16. The electrical safety apparatus of claim 1, wherein the controller includes a GNSS sensor, the controller processor configured to compare a geographic position of such GNSS sensor to a database of known geographic positions of electrical conductors and to disable the existing control system of the mobile machinery if the geographic positions are within a predetermined proximity.

17. An electrical safety arrangement for mobile machinery, comprising:
   mobile machinery; and
   the electrical safety apparatus of claim 1, wherein at least one sensor module is mounted to a portion of the machinery operable near an electrical conductor and the controller is interfaced with an existing control system of such mobile machinery, the controller only allowing movement of the portion, which, when the limiting signal is generated, reduces the sampled E-field voltage below the predetermined amplitude threshold.

18. Mobile machinery including the electrical safety apparatus of claim 1.

* * * * *

UNITED STATES PATENT AND TRADEMARK OFFICE
CERTIFICATE OF CORRECTION

| | | |
|---|---|---|
| PATENT NO. | : 12,198,522 B2 | |
| APPLICATION NO. | : 18/007336 | |
| DATED | : January 14, 2025 | |
| INVENTOR(S) | : Karl Rosewarne et al. | |

It is certified that error appears in the above-identified patent and that said Letters Patent is hereby corrected as shown below:

In the Specification

| | | |
|---|---|---|
| Column 2, | Lines 26-27, | change "same characteristics. Therefore, they are" to --same characteristics. Therefore, they are-- |
| Column 2, | Lines 38-39, | change "voltage is present. Electric fields are" to --voltage is present. Electric fields are-- |
| Column 4, | Line 24, | change "such IU detected" to --such IMU detected-- |
| Column 7, | Lines 12-13, | change "in lengthx80 mm" to --in length x 80 mm-- |
| Column 9, | Line 36, | change "170Lx120 Wx35H" to --170Lx120Wx35H-- |
| Column 12, | Lines 35-36, | change "in the figures. Spatially relative" to --in the figures. Spatially relative-- |

Signed and Sealed this
Eighth Day of April, 2025

Coke Morgan Stewart
*Acting Director of the United States Patent and Trademark Office*